US009141155B2

(12) United States Patent
Wiley

(10) Patent No.: US 9,141,155 B2
(45) Date of Patent: *Sep. 22, 2015

(54) COOLING COMPUTING ASSETS IN A DATA CENTER USING A HOT STACK

(71) Applicant: Scott Wiley, Los Altos, CA (US)

(72) Inventor: Scott Wiley, Los Altos, CA (US)

(73) Assignee: Facebook, Inc., Menlo Park, CA (US)

( * ) Notice: Subject to any disclaimer, the term of this patent is extended or adjusted under 35 U.S.C. 154(b) by 156 days.

This patent is subject to a terminal disclaimer.

(21) Appl. No.: 13/673,890

(22) Filed: Nov. 9, 2012

(65) Prior Publication Data
US 2014/0133088 A1 May 15, 2014

(51) Int. Cl.
H05K 7/20 (2006.01)
G06F 1/20 (2006.01)
H05K 5/00 (2006.01)
H01L 23/473 (2006.01)

(52) U.S. Cl.
CPC .............. *G06F 1/20* (2013.01); *H05K 7/20745* (2013.01)

(58) Field of Classification Search
CPC ............. H05K 7/20; H05K 7/20218–7/20381; H05K 7/20409–7/20418; H05K 7/20009–7/202; H01L 23/473; H01L 23/367–23/3677; H01L 23/46–23/467; G06F 1/181–1/182
USPC ........................ 361/679.46–679.54, 688–723, 361/724–727, 676–678, 699–704, 709–710, 361/719–721; 165/80.1–80.5, 104.33, 185; 454/184; 312/236; 174/15.1–15.3, 174/16.1–16.3, 547, 548; 257/712–722, 257/E23.088
See application file for complete search history.

(56) References Cited

U.S. PATENT DOCUMENTS

| 7,214,131 | B2 * | 5/2007 | Malone ......................... 454/184 |
| 8,537,536 | B1 * | 9/2013 | Rembach .................. 361/679.47 |
| 8,804,333 | B2 * | 8/2014 | Ashby ............................. 361/695 |
| 2005/0024826 | A1 * | 2/2005 | Bash et al. ...................... 361/695 |
| 2007/0064391 | A1 * | 3/2007 | Lewis, II et al. ............... 361/695 |
| 2007/0171613 | A1 * | 7/2007 | McMahan et al. ............. 361/695 |
| 2007/0213000 | A1 * | 9/2007 | Day .............................. 454/184 |
| 2008/0024977 | A1 * | 1/2008 | Coglitore et al. ............. 361/687 |
| 2008/0174954 | A1 * | 7/2008 | VanGilder et al. ............ 361/687 |
| 2008/0198549 | A1 * | 8/2008 | Rasmussen et al. .......... 361/696 |
| 2009/0126909 | A1 * | 5/2009 | Ellsworth et al. ........ 165/104.33 |
| 2009/0154159 | A1 * | 6/2009 | Graybill et al. ........... 362/249.02 |
| 2009/0168345 | A1 * | 7/2009 | Martini ......................... 361/691 |
| 2009/0173473 | A1 * | 7/2009 | Day ................................ 165/67 |
| 2009/0251860 | A1 * | 10/2009 | Belady et al. ................. 361/690 |
| 2010/0061057 | A1 * | 3/2010 | Dersch et al. ................. 361/690 |
| 2010/0216388 | A1 * | 8/2010 | Tresh et al. ................... 454/184 |
| 2010/0286955 | A1 * | 11/2010 | VanGilder et al. ............ 702/182 |
| 2011/0021134 | A1 * | 1/2011 | Zwern ........................... 454/343 |
| 2011/0105015 | A1 * | 5/2011 | Carlson ......................... 454/253 |
| 2011/0122570 | A1 * | 5/2011 | Beck et al. ................. 361/679.46 |
| 2011/0128699 | A1 * | 6/2011 | Heydari et al. .......... 361/679.48 |
| 2011/0278928 | A1 * | 11/2011 | Burger et al. ................... 307/39 |
| 2012/0033368 | A1 * | 2/2012 | Archibald et al. ....... 361/679.02 |

* cited by examiner

Primary Examiner — Anthony Haughton
Assistant Examiner — Razmeen Gafur
(74) Attorney, Agent, or Firm — Fenwick & West LLP

(57) ABSTRACT

A data center includes a hot stack for exhausting heated air from the data center. As air flows across computing assets operating in the data center, the air absorbs heat generated by the computing assets. The temperature difference between the heated air and air outside the data center, the height of the hot stack, and the area of the hot stack causes the heated air to flow through the hot stack and outside of the data center. This air flow may be used to decrease the pressure of a portion of the data center, causing air to flow from a higher pressure portion of the data center to the depressurized portion of the data center.

12 Claims, 2 Drawing Sheets

COOLING COMPUTING ASSETS IN A DATA CENTER USING A HOT STACK

BACKGROUND

This invention relates generally to data centers, and more particularly to efficient cooling of computing devices within a data center.

Heat removal is an important consideration in computer system and data center design. As the number of computing assets deployed in a data center increases, heat generated by electronic components in the computing assets during operation also increases. Because the reliability of computing assets used by the data center decreases if they operate at a high temperature over time, a portion of the data center's power is used for cooling electronics in the computing assets. However, as the number of computing assets included in a data center increases, a greater portion of the power consumed by the data center is used to cool electronics within the computing assets.

Conventionally, computing assets in a data center are individually equipped with cooling systems to dissipate heat produced during operation. Commonly, each server includes a fan for dissipating heat generated during operation. However, these internal fans generally consume about 10%-15% of the power used by the computing assets, and also produce heat during operation, limiting their effectiveness. Additionally, a room in the data center housing the computing assets may also be cooled using methods such as air conditioning, using additional power for cooling.

SUMMARY

Embodiments of the invention reduce or eliminate the need for power drawing sources, such as fans or air conditioning systems, to cool computing assets in a data center. A compartment in a data center includes computing assets, such as servers, and receives air from outside the data center through an opening, such as a vent. The air is directed across the computing assets, absorbing heat generated from the computing assets during operation.

The heated air is directed toward a hot stack which exhausts the heated air from the compartment. The height of the hot stack and the temperature difference between the heated air and the air outside of the data center creates an air flow through the hot stack that directs the heated air out of the compartment. Hence, the hot stack creates airflow out of the compartment that depressurizes a portion of the compartment. For example, the computing assets are oriented so a first side is proximate to a cold aisle and a second side is proximate to a hot aisle. The hot stack is coupled to the hot aisle, and as air flows across the computing assets and absorbs heat, the heated air is directed out of the compartment via the hot stack, depressurizing the hot aisle.

In some embodiments, turbines may be placed in the path of the airflow through the compartment and/or from the compartment to the hot stack to generate power from the airflow. The power may be supplied to the computing assets or to other systems of the data center. In one embodiment, a sensor monitors air temperature, air pressure, and/or air flow and adjusts the intake of air into the compartment or the exhaust of air from the compartment based on the monitored data. For example, if the temperature near one or more computing assets reaches a threshold value or the airflow near one or more computing assets reaches a threshold flow rate, the sensor communicates with a control system, which generates a control signal increasing the airflow through the compartment or cooling the external air directed into the compartment.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Data Center Architecture

Figure 1:
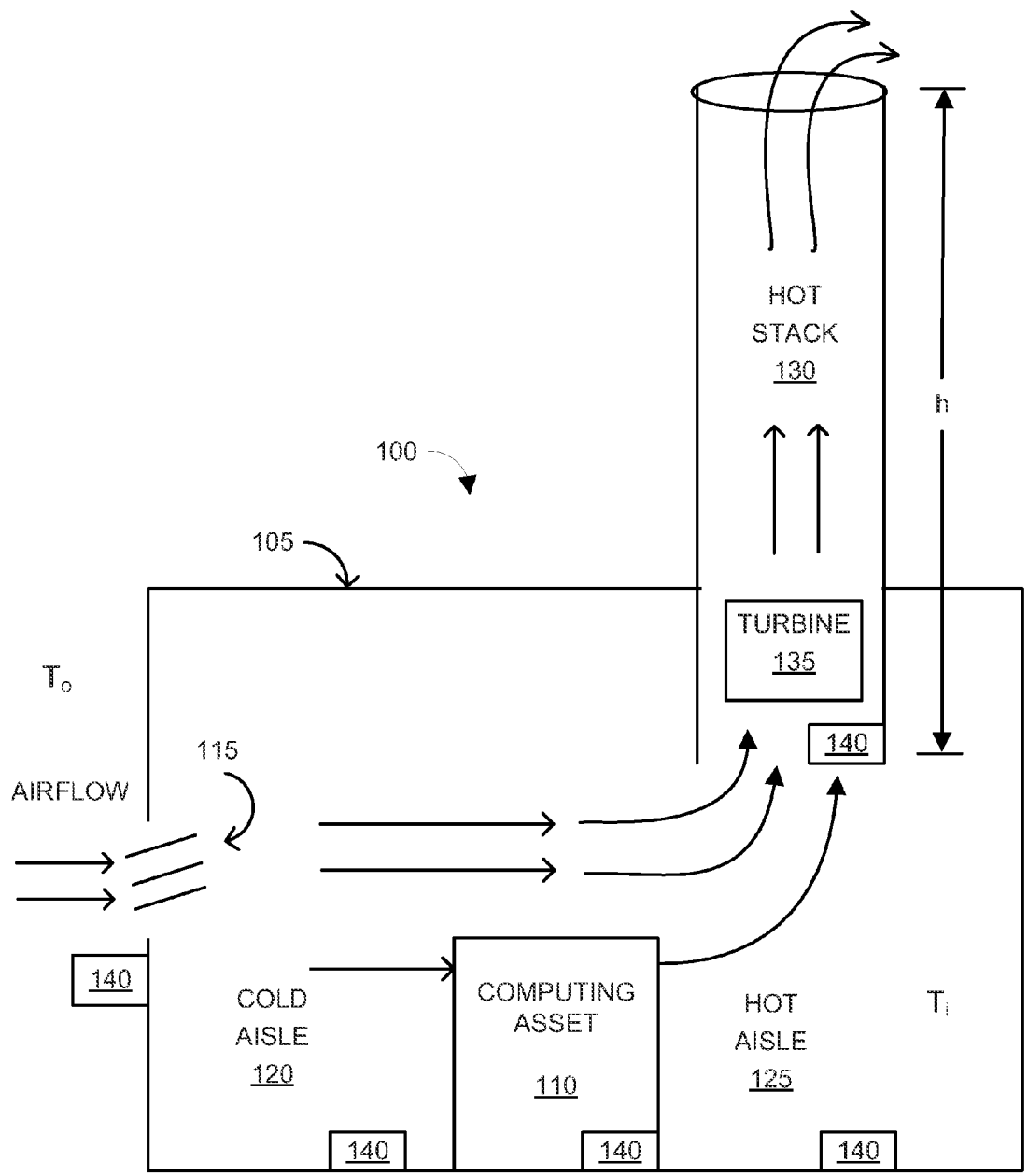
FIG. 1 is a side view of a data center for cooling computing assets using a hot stack to direct airflow through the data center in accordance with an embodiment of the invention.

An example data center 100 cooling one or more computing assets 110, such as servers, is illustrated in FIG. 1. In one embodiment, air from outside of the data center 100 is directed into a compartment 105 that includes a plurality of computing assets 110. During operation, this plurality of computing assets 110 generates heat. The air directed into the compartment flows across the computing assets 110 and absorbs the heat generated during operation. This increases the temperature of the air inside the compartment 105 that has passed across the computing assets 110.

In the example of FIG. 1, the computing assets 110 have a first side proximate to a cold aisle 120 of the compartment, and the air from outside the data center 100 is directed into the cold aisle 120 through an intake opening 115, such as a vent. The air flows across the computing assets 110 and to a hot aisle 125, which is proximate to a second side of the computing assets 110. Passing across the computing assets 110 warms the air, so the air in the hot aisle 125 has a temperature $T_i$ that is larger than a temperature $T_o$ of air outside the data center 100. Because of the operation of the computing assets 110, the temperature of the entering external air will generally be lower than the air within the compartment 105 ($T_o < T_i$). If the data center 100 is located in a cold environment, this temperature difference may be significant. In some embodiments, the incoming air that passes through the intake opening 115 may be further cooled by a cooling system. For example, an injector system is proximate to the intake opening 115 and releases droplets of a liquid, such as water, to evaporatively cool the incoming air.

A hot stack 130, such as a chimney or other structure with a height and an area, is fluidly connected to the hot aisle 125 and directs air from the hot aisle 125 to the exterior of the data center 100. Because the air in the hot aisle 125 is warmed from the heat generated by the computing assets 110, air in the hot aisle is less dense than the cooler air outside of the data center 100. This creates a "stack effect," which generally refers to an airflow resulting from warm air rising, which creates a positive pressure area at the top of a structure, such as the hot stack 130, and negative pressure area at the bottom.

The pressure difference creating the stack effect may be calculated using the following equation:

$$\Delta P = Cah\left(\frac{1}{T_o} - \frac{1}{T_i}\right),$$

where:
ΔP=available pressure difference;
C=a constant, 0.0342 in SI units or 0.0188 in U.S. units;
a=atmospheric pressure;
h=height or distance of the structure;
$T_o$=absolute outside temperature;
$T_i$=absolute inside temperature.

The airflow rate caused by the stack effect, which describes the airflow rate through the hot stack 130 is calculated using:

$$Q = CA\sqrt{2gh\frac{T_i - T_o}{T_i}},$$

where:
Q=stack effect draft flow rate;
A=flow area (i.e., area of the hot stack 130);
C=discharge coefficient (usually taken to be from 0.65 to 0.70);
g=gravitational acceleration;
h=height (i.e., height of the hot stack 130);
$T_i$=average air temperature inside the hot stack 130;
$T_o$=air temperature outside the data center 100.

As indicated by the arrows in FIG. 1, the stack effect causes air to flow from the hot aisle 125 through the hot stack 130 and to the outside of the data center 100. This airflow through the hot stack 130 reduces the pressure of the hot aisle 125 relative to the cold aisle 120, causing air to flow from the intake opening 115 to the cold aisle 120 and across the computing assets 110 to the hot aisle 125. In some embodiments, the cold aisle 120 is partitioned from the hot aisle 125 so that the path of least resistance from the cold aisle 120 to the hot aisle 125 is through the computing assets 110.

The hot stack 130 is a structure, such as a chimney, that protrudes from the data center 100 and is coupled to the hot aisle 125 via an opening. The hot stack 130 has a height measured from a suitable reference point, such as from the opening, a surface of the data center 100, ground level, or any other suitable reference point. The height of the hot stack 130 may vary depending on the environment, including the data center 100, operation of the computing assets 110, or any other suitable factors. In some embodiments, the hot stack 130 has a sufficient height so that the stack effect causes air to flow from the hot aisle 125 through the hot stack 130 without using fans. For example, the hot stack 130 has a height of 170 feet from the opening; however, in other embodiments, the height of the hot stack 130, measured from the opening, may vary (e.g., a height of at least 25 feet, at least 50 feet, at least 100 feet, etc.). In some embodiments, a heat absorbent coating may be applied to the hot stack 130 to increase the temperature of air in the hot stack 130 by absorbing heat from the environment surrounding the data center 100. For example, the hot stack 130 may be painted black to increase an amount of solar energy absorbed by the hot stack 130.

In some embodiments, the data center 100 includes one or more turbines 135 generating power from the flow of air through the hot stack 130 or through the compartment 105. Power generated by the one or more turbines 135 may be used to power the computing assets 110 and/or other components of the data center 100. In one embodiment, turbines 135 are located along the path in which air flows from the hot aisle 125 to the hot stack 130. In other embodiments, the turbines 135 are included in the hot stack 130.

In different embodiments, the flow of air through the data center 100 may be statically or dynamically controlled. If air flow is statically controlled, the intake opening 115 may be louver-based and provide cooler air in different directions, at different flow rates, and/or at different temperature levels. Alternatively, the intake opening 115 may include one or more control systems for dynamically modifying the airflow provided to the cold aisle 120 from outside of the data center 100 by changing the speed of one or more supply fans, repositioning one or more air supply louvers (or otherwise redirecting the airflow), or changing the temperature to which the airflow is cooled.

The data center 100 may include one or more sensors 140 in locations where air flows through from the cold aisle 120 to the hot aisle 125. The sensors 140 may be included in additional locations as well, such as external to the data center 100, proximate to the intake opening 115, proximate to the opening of the hot stack 130, within the hot stack 130, proximate to the computing assets 110, or any other suitable locations. The sensors 140 may monitor any relevant air characteristic, such as, air flow, air temperature, air humidity, absolute air pressure, differential air pressure, or any other data describing air flow or air temperature proximate to a sensor location, and combinations thereof. In another embodiment, sensors 140 are positioned at locations within the cold aisle 120, at locations within the hot aisle 125, at locations within one or more servers 105, at locations within the hot stack 130, at locations proximate to the intake opening 115 or in any combination of the above-described locations.

The sensors 140 communicate with a control system 150 coupled to, or included in, the air intake system and/or a cooling system to modify how air is directed into the data center 100 or how air provided to the compartment 105 is cooled. The control system 150 generates a control signal responsive to data from one or more sensors 140 to modify operation of an air intake associated with the intake opening 115 or a cooling system. For example, responsive to detecting a temperature reaching a threshold value, an air flow reaching a threshold flow rate, or a pressure difference between the hot aisle 125 and the cold aisle 120 falling below a threshold value, a sensor 140 communicates with the control system 150, which generates a control signal increasing the rate at which air is taken into the data center 100 or modifying a characteristic of air supplied to the cold aisle 120. Hence, the sensors 140 and control system 150 implement a feedback loop allowing the data center 100 to modify airflow through the compartment 105 responsive to changes in the exterior environment or in the data center environment, improving cooling of the computing assets 110. In embodiments including turbines 135 generating power from airflow, the control system 150 may also regulate the amount of power generated and/or how the generated power is distributed to data center 100 components.

Figure 2:
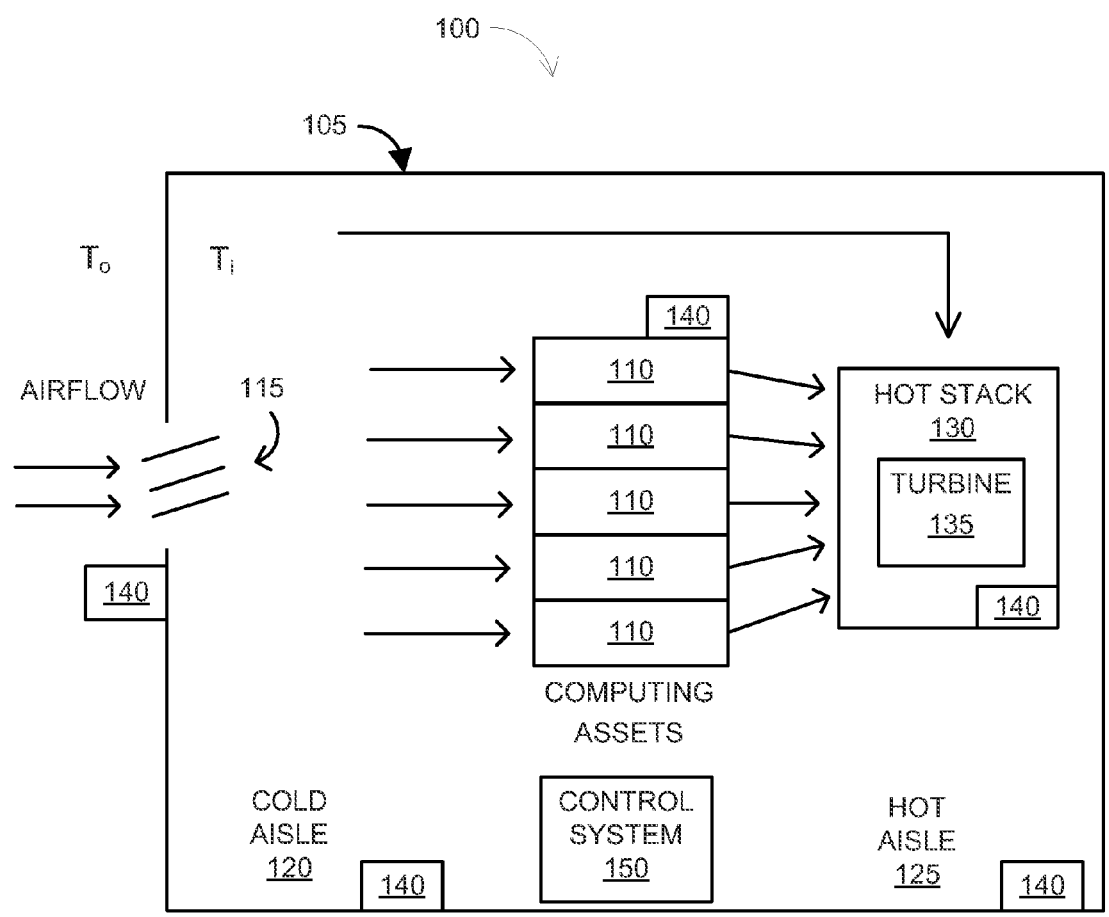
FIG. 2 is an overhead view of a data center for cooling computing assets using a hot stack to direct airflow through the data center in accordance with an embodiment of the invention.

FIG. 2 is a top view of the airflow in a compartment 105 of a data center 100 directing airflow through the compartment 105 using a stack effect from a hot stack 130. The arrows in FIG. 2 indicate the flow of air throughout the compartment 105. As shown in FIG. 2, an intake opening 115 directs air from outside of the data center 100 into a cold aisle 120 of the compartment 105. A first side of the computing assets 110 in the compartment 105 is proximate to the cold aisle 120, while a second side of the computing assets 110 is proximate to a hot aisle 125. As described above in conjunction with FIG. 1, operation of the computing assets 110 in the compartment 105 causes air inside the compartment 105 to have a higher temperature than air outside of the data center 100. This temperature difference and a height of the hot stack 130 causes air to flow from the hot aisle 125 through the hot stack 130 and outside of the compartment 105. This depressurizes the hot aisle 125 relative to the cold aisle 120 so that air flows from the cold aisle 120 over the computing assets 110 to the hot aisle 125, absorbing heat generated from operation of the computing assets 110. While FIGS. 1 and 2 show a single intake opening 115 and a single hot stack 130, other embodiments may have multiple intake openings 115 and/or multiple hot stacks 130. As described above in conjunction with FIG. 1, sensors 140 and a control system 150 are also provided.

As used herein, "cold air" or "cooler air" refers to air having a temperature less than an ambient air temperature, air having a temperature below a specified temperature, or air having a lower relative temperature than air in a different region. For example, exterior air can be referred to as "cold" or "cooler" air, when compared to the higher temperature of the air in the compartment 105 housing the operating computing assets 110 or the hot stack 130. As another example, air included in the cold aisle 120, referred to as "cold air," has a first temperature, while air included in the hot aisle 125, referred to as "hot air," has a second temperature that is higher than the first temperature.

While embodiments configured to include a cold aisle and a hot aisle are described above, the techniques described above may be applied to generate an airflow inside other data center configurations to cool computing assets included in the data center. For example, the preceding techniques may be applied to any suitable data center configuration to provide an airflow from one portion of the data center to another portion of the data center. Additionally, the techniques described above may be used in other cooling scenarios to provide an airflow across devices to extract heat from the devices.

For example, in one embodiment, a heat conductive element, such as a cold plate or cooling fin, is thermally coupled to one or more heat generating devices in the data center. The heat conductive element is configured to absorb heat generated during operation of the servers and other equipment in the data center, but it is not in fluidic connection with the equipment. In an embodiment, rather than using the ambient air flowing from a cold aisle through the servers to a hot aisle to cool the equipment, the ambient air is directed through the heat conductive element. This cooling airflow extracts heat from the equipment, and the heated air then exits the data center via an exhaust, such as a hot stack. This cooling airflow is thus open to the atmosphere, whereas any airflow within the equipment is part of a closed loop. This embodiment may provide a lower resistance to the cooling airflow, thereby lowering the requirements of the hot stack and/or any fans in the path to generate the airflow necessary for proper cooling. This may also reduce or eliminate the need for filters, as the external air does not come into direct contact with the servers, which further lowers the resistance of the airflow path and reduces costs associated with maintaining the filters. In some embodiments, the heat conductive element can be part of the rack in which the servers are mounted or can be part of the servers themselves. In further embodiments, the path of airflow may also include a fan to facilitate the exhaust of heated air from the data center.

Summary

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium, which include any type of tangible media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A data center system comprising:
a plurality of computing assets included in a compartment, each computing asset having a first side oriented toward a cold aisle and having a second side oriented toward a hot aisle, the hot aisle having a lower pressure relative to the cold aisle so that incoming air having an ambient air temperature flows from the cold aisle to the hot aisle across the computing assets;
an intake opening configured to receive air from outside of the data center and direct the air to the cold aisle; and a hot stack coupled to the hot aisle via an opening, the hot stack extending outside of the data center and having a height from the opening sufficient to, at a temperature difference between a temperature of air in the hot aisle and a temperature of the air outside of the data center, create a pressure difference that causes air to flow from the hot aisle through the opening and through the hot stack at a rate based at least in part on the height of the hot stack and a cross-sectional area of the hot stack.

2. The data center system of claim 1, further comprising one or more turbines included in the compartment and positioned along a flow of air from the hot aisle through the opening to the hot stack, the one or more turbines configured to generate power from the flow of air.

3. The data center system of claim 1, further comprising one or more turbines included in the hot stack, the one or more turbines configured to generate power from air flowing through the hot stack.

4. The data center system of claim 1, wherein the hot stack is coated with a heat absorbing coating for capturing heat from an environment surrounding the data center system.

5. The data center system of claim 4, wherein the heat absorbing coating comprises black paint.

6. A method comprising:
operating a plurality of computing assets arranged so a first side of the computing assets are oriented toward a cold aisle of a compartment in a data center and a second side of the computing assets are oriented toward a hot aisle of the compartment;
directing air external to data center into the cold aisle through an intake opening;
depressurizing the hot aisle relative to the cold aisle by directing incoming air having an ambient air temperature from the hot aisle through a hot stack coupled to the hot aisle, the air from the hot aisle directed through the hot stack at an air flow rate based on a difference between a temperature of air in the hot aisle and a temperature of the air external to the hot aisle and on a height of the hot stack; and generating power from air directed from the hot aisle through the hot stack using one or more turbines included in the hot stack.

7. The method of claim 6, wherein the temperature of air in the hot aisle is at least a threshold amount greater than the temperature of the air external to the hot aisle.

8. A data center system comprising:
a plurality of computing assets included in a compartment, each computing asset having a first side oriented toward a cold aisle and having a second side oriented toward a hot aisle, the hot aisle having a lower pressure relative to the cold aisle so that incoming air having an ambient air temperature flows from the cold aisle to the hot aisle across the computing assets;
an intake opening configured to receive air from outside of the data center and direct the air to the cold aisle; and
a hot stack coupled to the hot aisle via an opening, the hot stack extending a height from the opening and air flowing from the hot aisle through the opening at a rate dependent on: a temperature difference between a temperature of air in the hot aisle and a temperature of the air outside of the data center, a cross-sectional area of the hot stack, and the height of the hot stack.

9. The data center system of claim 8, further comprising one or more turbines included in the compartment and positioned along an air flow path from the hot aisle through the opening to the hot stack, the one or more turbines configured to generate power from air flowing from the hot aisle through the opening.

10. The data center system of claim 8, further comprising one or more turbines included in the hot stack, the one or more turbines configured to generate power from air flowing through the hot stack.

11. The data center system of claim 8, wherein the hot stack is coated with a heat absorbing coating for capturing heat from an environment surrounding the data center system.

12. The data center system of claim 11, wherein the heat absorbing coating comprises black paint.

* * * * *